United States Patent
Lee et al.

(10) Patent No.: US 12,099,146 B2
(45) Date of Patent: Sep. 24, 2024

(54) SINGLE PHOTON DETECTOR, ELECTRONIC DEVICE, AND LiDAR DEVICE

(71) Applicant: TRUPIXEL INC., Daejeon (KR)

(72) Inventors: Myung-Jae Lee, Seoul (KR); Do Kyung Hwang, Seoul (KR)

(73) Assignee: TRUPIXEL INC., Daejeon (KR)

( * ) Notice: Subject to any disclaimer, the term of this patent is extended or adjusted under 35 U.S.C. 154(b) by 0 days.

(21) Appl. No.: 18/308,259

(22) Filed: Apr. 27, 2023

(65) Prior Publication Data

US 2024/0241229 A1    Jul. 18, 2024

(30) Foreign Application Priority Data

Jan. 13, 2023    (KR) .................. 10-2023-0005079

(51) Int. Cl.
  *G01S 7/4863*    (2020.01)
  *G01J 1/44*    (2006.01)
  *G01S 17/931*    (2020.01)

(52) U.S. Cl.
  CPC .............. *G01S 7/4863* (2013.01); *G01J 1/44* (2013.01); *G01S 17/931* (2020.01); *G01J 2001/442* (2013.01); *G01J 2001/4446* (2013.01)

(58) Field of Classification Search
  CPC ........ G01S 7/4863; G01S 17/931; G01J 1/44; G01J 2001/442; G01J 2001/4446
  See application file for complete search history.

(56) References Cited

U.S. PATENT DOCUMENTS

| | | |
|---|---|---|
| 8,552,482 B2 | 10/2013 | Henderson |
| 9,065,002 B2 | 6/2015 | Finkelstein |
| 9,312,401 B2 | 4/2016 | Webster |
| 9,825,073 B2 | 11/2017 | Webster |
| 10,438,987 B2 | 10/2019 | Mandai |
| 10,804,309 B2 | 10/2020 | Otake |
| 11,374,135 B2 * | 6/2022 | Wang ............ H01L 31/0312 |
| 11,522,097 B2 * | 12/2022 | Lim ............ H01L 31/035272 |
| 2012/0205731 A1 | 8/2012 | Henderson |
| 2012/0261729 A1 | 10/2012 | Finkelstein |
| 2015/0200222 A1 | 7/2015 | Webster |

(Continued)

FOREIGN PATENT DOCUMENTS

| | | |
|---|---|---|
| EP | 3 738 147 B1 | 11/2021 |
| JP | 07-221341 A | 8/1995 |

(Continued)

OTHER PUBLICATIONS

Manuel Moreno-Garcia et al., "Low-Noise Single Photon Avalanche Diodes in a 110nm CIS Technology," ESSDERC 2018 (doi: 10.1109/ESSDERC.2018.8486883).

(Continued)

*Primary Examiner* — Seung C Sohn

(57) ABSTRACT

Disclosed is a single photon detector comprising a semiconductor substrate and a 2D material layer provided adjacent to the semiconductor substrate, the semiconductor substrate includes a first well having a first conductivity type, a heavily doped region having a second conductivity type different from the first conductivity type, and a depletion region provided between the first well and the heavily doped region.

14 Claims, 23 Drawing Sheets

(56) References Cited

U.S. PATENT DOCUMENTS

| | | |
|---|---|---|
| 2015/0200314 A1 | 7/2015 | Webster |
| 2015/0340391 A1 | 11/2015 | Webster |
| 2018/0090536 A1 | 3/2018 | Mandai |
| 2020/0091208 A1 | 3/2020 | Otake |
| 2021/0199769 A1 | 7/2021 | Meylan |

FOREIGN PATENT DOCUMENTS

| | | |
|---|---|---|
| JP | 2001-518719 A | 10/2001 |
| JP | 2015-041746 A | 3/2015 |
| JP | 2021-192452 A | 12/2021 |
| KR | 10-2019-0059667 A | 5/2019 |
| KR | 10-2020-0073683 A | 6/2020 |
| KR | 10-2020-0122591 A | 10/2020 |
| KR | 10-2022-073960 A | 6/2022 |

OTHER PUBLICATIONS

I. Vornicu et al., "Low-Noise and High-Efficiency Near-IR SPADs in 110nm CIS technology," ESSDERC 2019 (doi: 10.1109/ESSDERC.2019.8901757).

Dongseok Shin et al., "The Effect of a Deep Virtual Guard Ring on the Device Characteristics of Silicon Single Photon Avalanche Diodes," IEEE TED 2019 (doi: 10.1109/TED.2019.2913714).

* cited by examiner

SINGLE PHOTON DETECTOR, ELECTRONIC DEVICE, AND LiDAR DEVICE

CROSS-REFERENCE TO RELATED APPLICATIONS

This application claims priority under 35 U.S.C. § 119 to Korean Patent Application No. 10-2023-0005079 filed on Jan. 13, 2023, in the Korean Intellectual Property Office, the disclosures of which are incorporated by reference herein in their entireties.

BACKGROUND

1. Technological Field

Embodiments of the present disclosure described herein relate to single photon detector, electronic device, and LiDAR device.

The inventors acknowledge the financial support from the Korea Institute of Science and Technology (KIST) Institution Program (Grant No. 2E32242) and the National Research Foundation of Korea (NRF) (Grant No. 2021M3D1A2046731).

2. Description of the Related Art

The Avalanche Photodiode (APD) is a solid-state light detector in which a high bias voltage is applied to the PN conjugation to provide a high first step gain from Avalanche Multiplication. When a photon with enough energy to release the electron reaches the photo diode, an electron-hole pair (EHP) is generated. The high electric field accelerates the photo-generated electrons quickly to (+) side, and the additional electrons-hole pairs are generated in succession by the impact ionization by such acceleration electrons. And then the electrons accelerate to the anode. Similarly, the holes are accelerated quickly toward (−) side and causes the same phenomenon. This process repeats the process leading to the Avalanche of the output current pulse and light generation electrons. Thus, APD is a semiconductor-based device that operates similarly to photomultiplier tubes. The linear mode APD is an effective amplifier that can control the bias voltage to set a gain and obtain tens of to thousands of gains in linear mode.

Single Photon Avalanche Diode (SPAD) is an APD in which the P-N bonding part is biased more than breakdown voltage to operate in the GEIGER mode. SPAD can generate a very large current, and as a result, a pulse signal that can be easily measured with a quenching resistor (or quenching circuit) can be obtained. That is, the SPAD operates as a device that generates a large pulse signal compared to the linear mode APD. After the triggering the Avalanche, the quenching resistance or the quenching circuit is used to reduce the bias voltage under the breakdown voltage for quenching the Avalanche process. Once the Avalanche Process is quenched, the bias voltage is rising back over the breakdown voltage so that the SPAD is reset for the detection of another photon. The above process can be referred to as re-biasing of SPAD.

SPAD can be configured with quenching resistance or circuit, recharge circuits, memory, gate circuits, counter, and time-digital converter. SPAD pixels are semiconductor-based, so it can be easily arrayed.

APD or SPAD may have a defect according to the manufacturing process. A defect in APD or SPAD can produce electrons. For example, electrons can be generated by defects according to the formation of the Shallow Trench Isolation (STI). The electrons generated by defects can be increased in a depletion region (or a multiplication region) in the APD or SPAD. As a result, noise signals may occur. In addition, the electrons generated by defects can be the cause of the after-pulse phenomenon in which Avalanche occurs even though the photon is not incident on the APD or SPAD. If after-pulse phenomenon is expected to occur, it may be necessary to increase the dead time, which is a preparation time for the APD or SPAD to detect one photon and the next photon, to prevent the impact. In some example embodiments, when the APD or SPAD operation, the frame rate or signal-to-noise ratio (SNR) may be reduced.

SUMMARY

Embodiments of the present disclosure provide a single photon detector, electronic device, and LiDAR device detecting photons having energy lower than the bandgap of the material constituting the semiconductor substrate. Embodiments of the present disclosure provide a single photon detector, electronic device, and LiDAR device detecting short-wavelength infrared light.

According to example embodiments, a single photon detector comprises a semiconductor substrate and a 2D material layer provided adjacent to the semiconductor substrate, the semiconductor substrate includes a first well having a first conductivity type, a heavily doped region having a second conductivity type different from the first conductivity type, and a depletion region provided between the first well and the heavily doped region.

According to further aspects of the invention, the single photon detector further comprises a fixing layer provided between the semiconductor substrate and the 2D material layer.

According to further aspects of the invention, the single photon detector further comprises a transition layer provided between the semiconductor substrate and the 2D material layer.

According to further aspects of the invention, the 2D material layer is provided opposite the heavily doped region with the first well interposed therebetween.

According to further aspects of the invention, the single photon detector further comprises a substrate region provided between the first well and the 2D material layer.

According to further aspects of the invention, the 2D material layer includes a tin transition metal or a chalcogenide-based material.

According to further aspects of the invention, the single photon detector further comprises a second well provided between the first well and the heavily doped region, the second well has the first conductivity type.

According to further aspects of the invention, the single photon detector further comprises a guard ring provided on a side surface of the heavily doped region, the guard ring has the second conductivity type.

According to further aspects of the invention, the single photon detector further comprises a contact spaced apart from the heavily doped region and a relief region provided between the contact and the first well, the contact and the relief region have the first conductivity type.

According to further aspects of the invention, the single photon detector further comprises a conductive layer provided on an opposite side of the semiconductor substrate with the 2D material layer interposed therebetween, the conductive layer includes a transparent conductive material.

According to further aspects of the invention, the single photon detector further comprises a conductive pattern provided on an opposite side of the semiconductor substrate with the 2D material layer interposed therebetween, the conductive pattern includes a transparent conductive material or metal.

According to further aspects of the invention, the single photon detector further comprises a control layer provided on the semiconductor substrate and a connection layer provided between the control layer and the semiconductor substrate.

According to example embodiments, an electronic device comprises a single photon detector including a semiconductor substrate and a 2D material layer provided adjacent to the semiconductor substrate, the semiconductor substrate includes a first well having a first conductivity type, a heavily doped region having a second conductivity type different from the first conductivity type, and a depletion region provided between the first well and the heavily doped region.

According to example embodiments, a LiDAR device comprises an electronic device including a single photon detector, the single photon detector includes a semiconductor substrate and a 2D material layer provided adjacent to the semiconductor substrate, the semiconductor substrate includes a first well having a first conductivity type, a heavily doped region having a second conductivity type different from the first conductivity type, and a depletion region provided between the first well and the heavily doped region.

BRIEF DESCRIPTION OF THE FIGURES

The above and other objects and features of the present disclosure will become apparent by describing in detail embodiments thereof with reference to the accompanying drawings.

DETAILED DESCRIPTION

Figure 1:
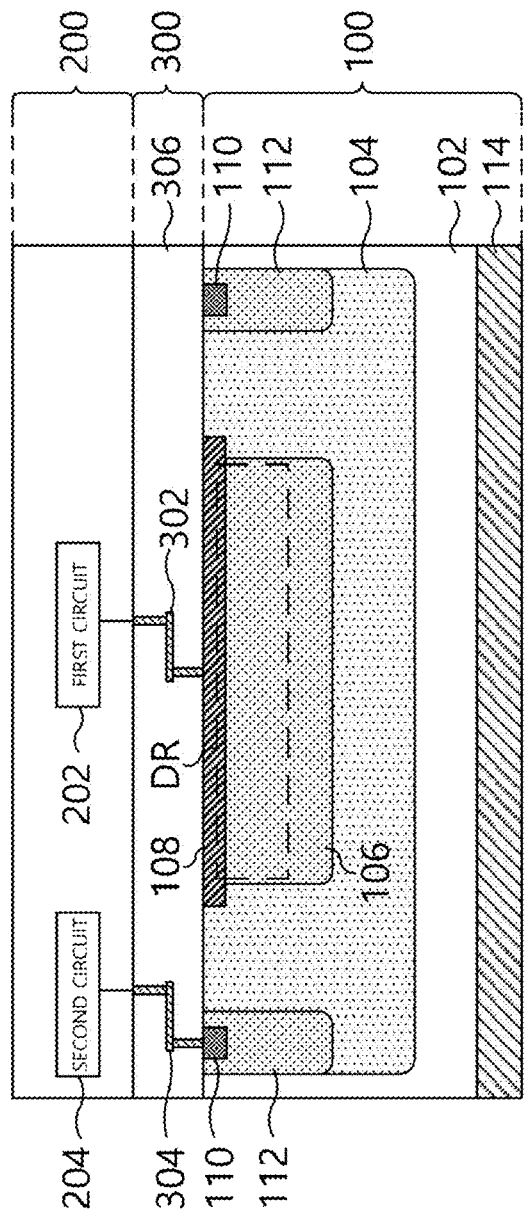
FIG. 1 shows a single photon detector according to an exemplary embodiment.

Hereinafter, with reference to the accompanying drawings, example embodiments of the present disclosure will be described in detail. In the following drawings, the same reference code refers to the same component, and the size of each component in the drawings may be exaggerated for the clarity and convenience of the description. On the other hand, example embodiments described below are only an example, and various variations are possible from these embodiments.

Hereinafter, what is described as "on" may include not only being directly on contact but also being on non-contact.

Singular expressions include plural expressions unless the context clearly dictates otherwise. In addition, when a certain component is said to "include", this means that it may further include other components without excluding other components unless otherwise stated.

In addition, terms such as "unit" or "part" described in the specification mean a unit that processes at least one function or operation.

FIG. 1 shows a single photon detector according to an exemplary embodiment.

Referring to FIG. 1, a single photon detector 10 may be provided. The single photon detector 10 may include a single photon avalanche diode (SPAD). A single photon avalanche diode (SPAD) may be referred to as a Geiger-mode avalanche diode (G-APD). The single photon detector 10 may include a detection element layer 100, a control layer 200, and a connection layer 300.

The detection element layer 100 includes a substrate region 102, a first well 104, a second well 106, a heavily doped region 108, a contact 110, a relief region 112, and a 2D material layer 114 may be included. The first well 104, the second well 106, the heavily doped region 108, the contact 110, and the relief region 112 may be formed by implanting impurities into a semiconductor substrate. For example, the semiconductor substrate may be a silicon substrate. The substrate region 102 may be a remaining portion of the semiconductor substrate excluding the first well 104, the second well 106, the heavily doped region 108, the contact 110, and the relief region 112. The semiconductor substrate may include a single photon detection device for detecting single photon. For example, substrate region 102, the first well 104, the second well 106, the heavily doped region 108, the contact 110, and the relief region 112 may constitute a single photon avalanche diode (SPAD).

The substrate region 102 may include silicon (Si). The conductivity type of the substrate region 102 may be n-type or p-type. When the conductivity type of the substrate region 102 is n-type, group 5 elements (eg, phosphorus (P), arsenic (As), antimony (Sb), etc.), group 6 or group 7 elements may be included as impurities. Hereinafter, a region having an n-type conductivity may include group 5, 6, or 7 elements as impurities. When the conductivity type of the substrate region 102 is p-type, group 3 elements (eg, boron (B), aluminum (Al), gallium (Ga), indium (In), etc.) or group 2 elements may be included as impurities. Hereinafter, a region having a p-type conductivity may include group 3 or group 2 elements as impurities. For example, the doping concentration of the substrate region 102 may be $1\times10^{14}$ to $1\times10^{19}$ cm$^{-3}$. The semiconductor substrate may be an epi layer formed by an epitaxial growth process.

The first well 104 may be provided on the substrate region 102. The first well 104 may directly contact the substrate region 102. The first well 104 may have a first conductivity type. Hereinafter, the first conductivity type may be n-type or p-type. For example, the doping concentration of the first well 104 may be $1\times10^{15}$ to $1\times10^{19}$ cm$^{-3}$. In one example, the doping concentration of the first well 104 may decrease as it is closer to the top surface of the single photon detector 10. In one example, the first well 104 may have a uniform doping concentration.

The second well 106 may be provided over the first well 104. The second well 106 may directly contact the first well 104. The second well 106 may have a first conductivity type. For example, the doping concentration of the second well 106 may be $1\times10^{15}$ to $1\times10^{18}$ cm$^{-3}$.

The heavily doped region 108 may be provided on the second well 106. The heavily doped region 108 may be provided on the top surface of the second well 106. The heavily doped region 108 may contact the second well 106. A width of the heavily doped region 108 may be greater than that of the second well 106. An end portion of the heavily doped region 108 may protrude from a side surface of the second well 106. The heavily doped region 108 may have a second conductivity type different from the first conductivity type. When the first conductivity type is n-type, the second conductivity type may be p-type. When the first conductivity type is p-type, the second conductivity type may be n-type. For example, the doping concentration of the heavily doped region 108 may be $1\times10^{15}$ to $1\times10^{22}$ cm$^{-3}$. When the single photon detector 10 is a single photon avalanche diode (SPAD), the heavily doped region 108 may be electrically connected to at least one of a quenching resistor (or quenching circuit) and other pixel circuits. A quenching resistor or quenching circuit may be configured to stop the avalanche effect and allow the single photon avalanche diode (SPAD) to detect another photon. Other pixel circuits may include, for example, reset or recharge circuits, memories, amplifier circuits, counters, gate circuits, time-to-digital converters, and the like. Other pixel circuits may transmit signals to or receive signals from the single photon detector 10. In one example, the heavily doped region 108 may be electrically connected to an external power source or an integrated power source (eg, DC-to-DC converter, a charge pump, a boost converter, and other power management integrated circuits).

The depletion region DR may be formed in a region adjacent to an interface between the second well 106 and the heavily doped region 108. When a reverse bias is applied to the single photon detector 10, a strong electric field may be formed in the depletion region DR. For example, the maximum magnitude of the electric field applied to the depletion region DR may be $1\times10^5$ to $1\times10^6$ V/cm. Since electrons may be multiplied by the electric field in the depletion region DR, the depletion region DR may be referred to as a multiplication region.

The contact 110 may be provided on the first well 104. The contact 110 may be electrically connected to an external circuit outside the single photon detector 10. If the single photon detector 10 includes a single photon avalanche diode (SPAD), the contact 110 may be electrically connected to at least one of an external power supply and an integrated power source (eg, DC-to-DC converter, a charge pump, a boost converter, and other power management integrated circuits). In one example, contact 110 may be electrically connected to at least one of a quenching resistor (or quenching circuit) and other pixel circuits. A quenching resistor or quenching circuit may stop the avalanche effect and allow the single photon avalanche diode (SPAD) to detect another photon. Other pixel circuits may include, for example, reset or recharge circuits, memories, amplifier circuits, counters, gate circuits, time-to-digital converters, and the like. Other pixel circuits may transmit signals to or receive signals from the single photon detector 10. The contact 110 may surround the heavily doped region 108 and the second well 106. In another example, a plurality of contacts 110 may be provided. In some example embodiments, each of the plurality of contacts may be electrically connected to an external circuit outside the single photon detector 10. The contact 110 may have a first conductivity type. A doping concentration of the contact 110 may be higher than that of the first well 104. For example, the doping concentration of the contact 110 may be $1\times10^{15}$ to $1\times10^{22}$ cm$^{-3}$.

The relief region 112 may be provided between the contact 110 and the first well 104. The relief region 112 may be electrically connected to the contact 110 and the first well 104. The relief region 112 may relieve a difference between the contact 110 and the first well 104. The relief region 112 may extend along the contact 110. The relief region 112 may be provided on side and bottom surfaces of the contact 110. For example, the relief region 112 may directly contact the side and bottom surfaces of the contact 110. The relief region 112 may surround the heavily doped region 108 and the second well 106. The relief region 112 may be apart from the heavily doped region 108 and the second well 106. The first well 104 may be disposed between the relief region 112 and the heavily doped region 108 and between the relief region 112 and the second well 106. For example, a region between the relief region 112 and the heavily doped region 108 and a region between the relief region 112 and the second well 106 may be filled with the first well 104. The relief region 112 may have a first conductivity type. A doping concentration of the relief region 112 may be lower than that of the contact 110 and may be similar to or higher than that of the first well 104. For example, the doping concentration of the relief region 112 may be $1\times10^{15}$ to $1\times10^{19}$ cm$^{-3}$.

The 2D material layer 114 may be provided on the bottom surface of the substrate region 102. The 2D material layer 114 may have bandgap energy capable of absorbing short-wavelength infrared (eg, light in a range of 1.3 μm to 1.5 μm). For example, the 2D material layer 114 may include a 2D semiconductor having a 2D crystal structure. The 2D semiconductor may be a metal chalcogenide-based material. The metal chalcogenide-based material may include a transition metal of Mo, W, Nb, V, Ta, Ti, Zr, Hf, Tc, and Re and a chalcogen element of S, Se, and Te. The metal chalcogenide-based material may be a transition metal dichalcogenide (TMDC) material. The TMDC material may be expressed, for example, as $MX_2$, where M is a transition metal and X is a chalcogen element. The M may be Mo, W, Nb, V, Ta, Ti, Zr, Hf, Tc, Re, etc., and the X may be S, Se, or Te. The TMDC material may be, for example, $MoS_2$, $MoSe_2$, $MoTe_2$, $WS_2$, $WSe_2$, $WTe_2$, $ZrS_2$, $ZrSe_2$, $HfS_2$, HfSez, NbSe$_2$, ReSe$_2$, or the like. A metal chalcogenide-based material may not be expressed as MX$_2$. For example, a compound of transition metal Cu and chalcogen element S (transition metal chalcogenide material) may be expressed as CuS. Since CuS may also be a 2D material, it may be applied as a metal chalcogenide-based material. The metal chalcogenide-based material may be a chalcogenide material containing a non-transition metal. The non-transition metal may be, for example, Ga, In, Sn, Ge, or Pb. That is, compounds of non-transition metal such as Ga, In, Sn, Ge, and Pb and chalcogen element such as S, Se, and Te may be used as the metal chalcogenide-based material. A chalcogenide material containing a non-transition metal may be, for example, SnSe$_2$, GaS, GaSe, GaTe, GeSe, In$_2$Se$_3$, InSnS$_2$, or the like. Therefore, the metal chalcogenide-based material may include one of a metal element of Mo, W, Nb, V, Ta, Ti, Zr, Hf, Tc, Re, Cu, Ga, In, Sn, Ge, Pb and one of the chalcogen elements of S, Se, Te. However, the materials (elements) presented here are exemplary, and other materials (elements) may be applied.

A silicon (Si) substrate may absorb visible light or near infrared rays to generate an electron-hole pair, but may not absorb short-wavelength infrared rays having a longer wavelength than near infrared rays. The 2D material layer 114 of the present disclosure may absorb short-wavelength infrared rays to generate electron-hole pairs. Accordingly, a single photon detector 10 that detects short-wavelength infrared light may be provided.

In one example, the substrate region 102 may not be provided between the first well 104 and the 2D material layer 114. Accordingly, the first well 104 and the 2D material layer 114 may directly contact each other. For example, the substrate region 102 between the first well 104 and the 2D material layer 114 may be removed through an etching process.

The control layer 200 may be provided on the detection element layer 100. The control layer 200 may include a first circuit 202 and a second circuit 204. For example, the control layer 200 may be a chip on which the first circuit 202 and the second circuit 204 are formed. Although each of the first circuit 202 and the second circuit 204 is shown as one block, this doesn't mean that the first circuit 202 and the second circuit 204 are only a single electronic element or a circuit having a single function. The circuit 202 may include a plurality of electronic elements and circuits having a plurality of functions as needed. When the single photon detector 10 may include a single photon avalanche diode (SPAD), the first circuit 202 and the second circuit 204 may include a quenching resistor or circuit and a read circuit. The quenching circuit may stop the avalanche effect and allow the single photon avalanche diode (SPAD) to detect another photon. Other pixel circuits may be composed of a reset or recharge circuit, a memory, an amplification circuit, a counter, a gate circuit, etc. Other pixel circuits may transmit a signal current to the detection element layer 100 or receive a signal current from the detection element layer 100. Although it is shown that the first circuit 202 and the second circuit 204 are provided within the control layer 200, this is exemplary. In another example, the first circuit 202 and the second circuit 204 may be located on a semiconductor substrate on which the single photon detection device 100 is formed.

The connection layer 300 may be provided between the detection element layer 100 and the control layer 200. The connection layer 300 may include a first conductive line 302 configured to electrically connect the heavily doped region 108, a second conductive line 304 configured to electrically connect the contact 110 and the second circuit 204, and an insulating layer 306. The first conductive line 302 and the second conductive line 304 may be inserted into the insulating layer 306. The first conductive line 302 and the second conductive line 304 may include an electrically conductive material. For example, the first and second conductive lines 302 and 304 may include copper (Cu), aluminum (Al), tungsten (W), titanium (Ti), titanium nitride (TiN), or a combination thereof. The first and second conductive lines 302 and 304 may include a plurality of portions extending along a direction crossing the front surface of the detection element layer 100 or a direction parallel to the front surface of the detection element layer 100. One of the first conductive line 302 and the second conductive line 304 may apply a bias, and the other may extract a detection signal. For example, the first conductive line 302 may extract an electrical signal from the heavily doped region 108, and the second conductive line 304 may apply a bias to the contact 110. In another example, the second conductive line 304 may extract an electrical signal from the contact 110 and the first conductive line 302 may apply a bias to the heavily doped region 108. The insulating layer 306 may include an electrically insulating material. For example, insulating layer 306 may include silicon oxide (eg, SiO$_2$), silicon nitride (eg, SiN), silicon oxynitride (eg, SiON), or combinations thereof.

Figure 2:
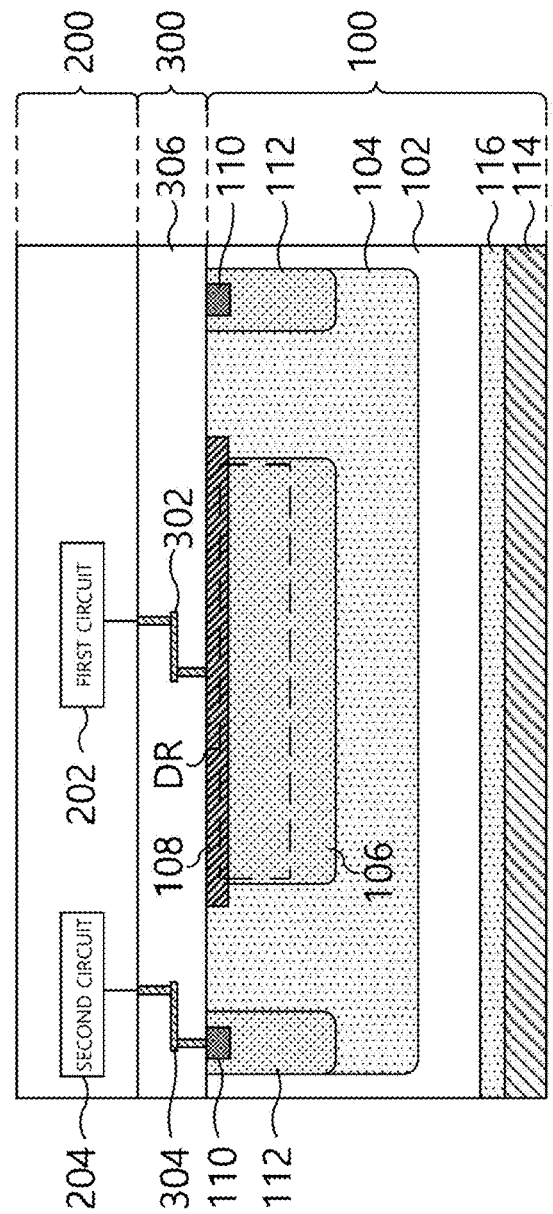
FIG. 2 shows a single photon detector according to an exemplary embodiment.

FIG. 2 shows a single photon detector according to an exemplary embodiment. Differences from those described with reference to FIG. 1 are described for brevity of description.

Referring to FIG. 2, a single photon detector 11 may be provided. Unlike the description with reference to FIG. 1, the single photon detector 11 may further include an insertion layer 116 between the substrate region 102 (ie, the semiconductor substrate) and the 2D material layer 114. The insertion layer 116 may be at least one of a fixing layer and a transition layer. The fixing layer may be configured such that the 2D material layer 114 is stably fixed to the bottom surface of the substrate region 102. The transition layer may be configured to increase the transfer efficiency of charges generated by light (eg, short-wavelength infrared light) incident on the 2D material layer 114 to the substrate region 102. For example, the insertion layer 116 may include an insulating film, a 2D material film, or an oxide thin film.

In one example, the substrate region 102 may not be provided between the first well 104 and the insertion layer 116. Accordingly, the first well 104 and the insertion layer 116 may directly contact each other. For example, the substrate region 102 between the first well 104 and the insertion layer 116 may be removed through an etching process.

The present disclosure may provide a single photon detector 11 with improved structural stability and charge transfer efficiency.

Figure 3:
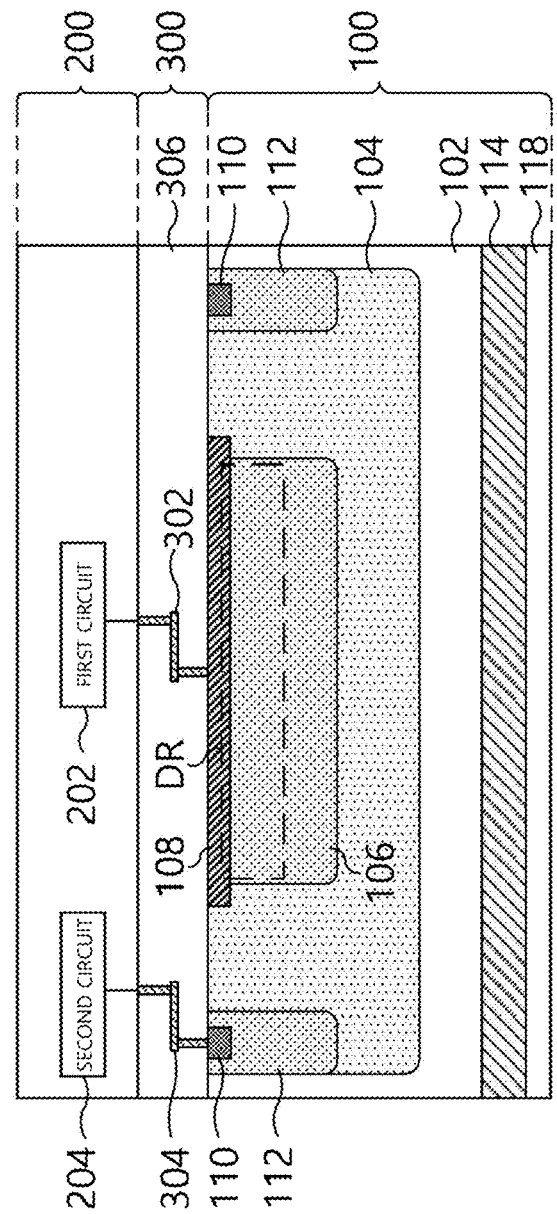
FIG. 3 shows a single photon detector according to an exemplary embodiment.

FIG. 3 shows a single photon detector according to an exemplary embodiment. Differences from those described with reference to FIG. 1 are described for brevity of description.

Referring to FIG. 3, a single photon detector 12 may be provided. Unlike that described with reference to FIG. 1, the single photon detector 12 may further include a conductive layer 118 provided on the opposite side of the substrate region 102 with the 2D material layer 114 interposed therebetween. The conductive layer 118 may cover a surface of the 2D material layer 114 located opposite the substrate region 102 (ie, the semiconductor substrate). For example, the conductive layer 118 may overlap the entire 2D material layer 114 along the stacking direction of the detection element layer 100 and the connection layer 300. For example, the conductive layer 118 may overlap the entirety of the first well 104 along the stacking direction of the detection element layer 100 and the connection layer 300. The conductive layer 118 may directly contact the 2D material layer 114. Conductive layer 118 may include a transparent conductive material. For example, the conductive layer 118 may include indium tin oxide (ITO), indium zinc oxide (IZO), ZnO, or $In_2O_3$. The conductive layer 118 may apply a voltage to the 2D material layer 114 so that charges generated by light (eg, short-wavelength infrared rays) incident on the 2D material layer 114 are easily transferred to the substrate region 102.

The present disclosure may provide a single photon detector 12 having improved charge transfer efficiency.

Figure 4:
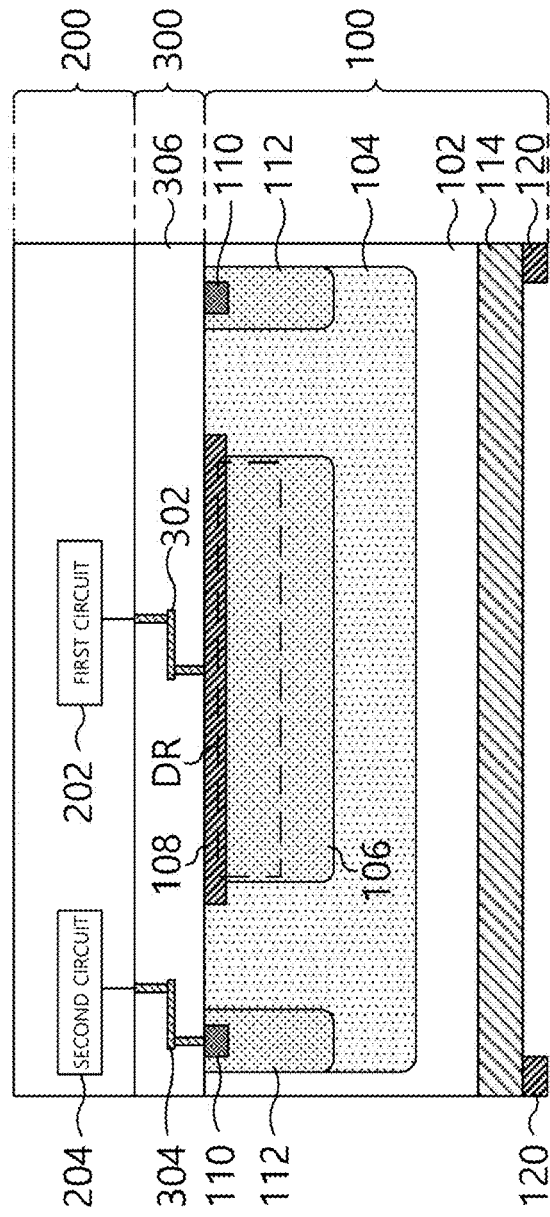
FIG. 4 shows a single photon detector according to an exemplary embodiment.

FIG. 4 shows a single photon detector according to an exemplary embodiment. Differences from those described with reference to FIG. 1 are described for brevity of description.

Referring to FIG. 4, a single photon detector 13 may be provided. Unlike that described with reference to FIG. 1, the single photon detector 13 may further include a conductive pattern 120 provided on the opposite side of the substrate region 102 (ie the semiconductor substrate) with the 2D material layer 114 interposed therebetween. The conductive pattern 120 may partially cover the 2D material layer 114. For example, the conductive layer 118 may partially overlap the 2D material layer 114 along the stacking direction of the detection element layer 100 and the connection layer 300. For example, from a viewpoint along the stacking direction of the detection element layer 100 and the connection layer 300, the conductive pattern 120 may overlap with the edge of the first well 104 and may not overlap with the inside of the first well 104. The conductive pattern 120 may include one pattern having a ring shape or a plurality of patterns spaced apart from each other. The conductive pattern 120 may directly contact the 2D material layer 114. The conductive pattern 120 may include a transparent conductive material (eg, indium tin oxide (ITO), indium zinc oxide (IZO), ZnO, or $In_2O_3$) or metal. The conductive pattern 120 may apply a voltage to the 2D material layer 114 so that charges generated by light (eg, short-wavelength infrared rays) incident on the 2D material layer 114 are easily transferred to the substrate region 102. When the conductive pattern 120 includes a plurality of patterns, the plurality of patterns may have substantially the same voltage.

The present disclosure may provide a single photon detector 13 with improved charge transfer efficiency.

Figure 5:
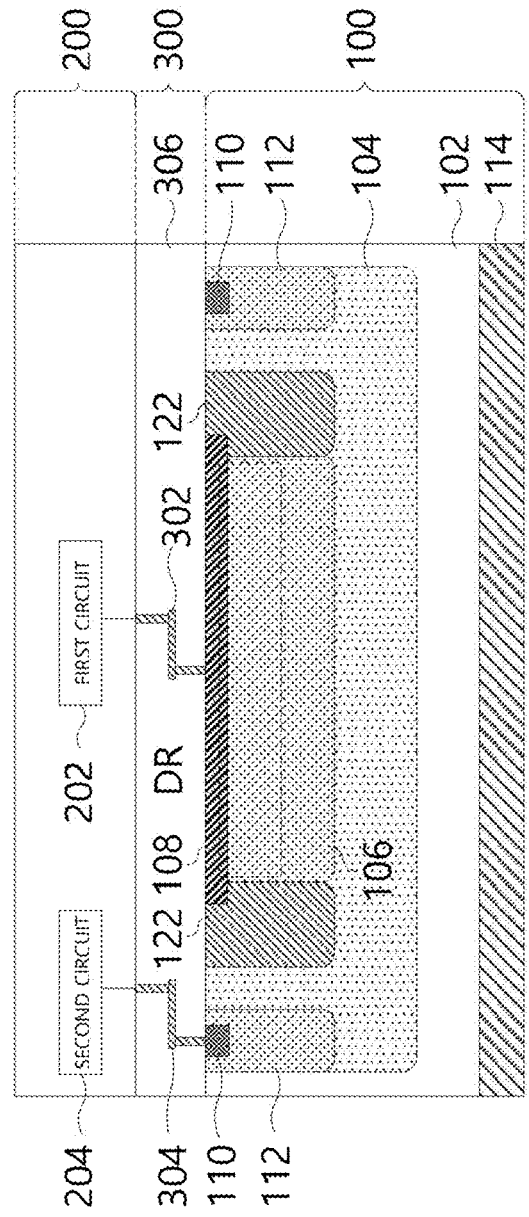
FIG. 5 shows a single photon detector according to an exemplary embodiment.

FIG. 5 shows a single photon detector according to an exemplary embodiment. Differences from those described with reference to FIG. 1 are described for brevity of description.

Referring to FIG. 5, a single photon detector 14 may be provided. Unlike the description with reference to FIG. 1, the single photon detector 14 may further include a guard ring 122. The guard ring 122 may be provided on a side surface of the heavily doped region 108 and a side surface of the second well 106. The guard ring 122 may surround the heavily doped region 108 and the second well 106. For example, the guard ring 122 may have a ring shape extending along the side surface of the heavily doped region 108 and the side surface of the second well 106. The guard ring 122 may directly contact the heavily doped region 108 and the second well 106. In another example, the guard ring 122 may be apart from the heavily doped region 108 and the second well 106. The top surface of the guard ring 122 may be disposed at substantially the same height as a top surface of the heavily doped region 108. The bottom surface of the guard ring 122 may be disposed at substantially the same height as the bottom surface of the second well 106. However, the depth of the guard ring 122 may be determined according to the needs. For example, the guard ring 122 may be formed so that the bottom surface of the guard ring 122 is disposed above or below the second well 106. The guard ring 122 may have a second conductivity type. The doping concentration of the guard ring 122 may be lower than that of the heavily doped region 108. For example, the doping concentration of the guard ring 122 may be $1\times10^{15}$ to $1\times10^{18}$ $cm^{-3}$. The guard ring 122 may improve breakdown characteristics of the single photon detector 14. In detail, the guard ring 122 can relieve concentration of an electric field at the edge of the heavily doped region 108 to prevent premature breakdown. The premature breakdown phenomenon is a breakdown phenomenon that first occurs at the corner of the heavily doped region 108 before an electric field of sufficient magnitude is applied to the depletion region. The premature breakdown phenomenon occurs as the electric field is concentrated at the corners of the heavily doped region 108.

The present disclosure may provide a single photon detector 14 having improved electrical durability.

Figure 6:
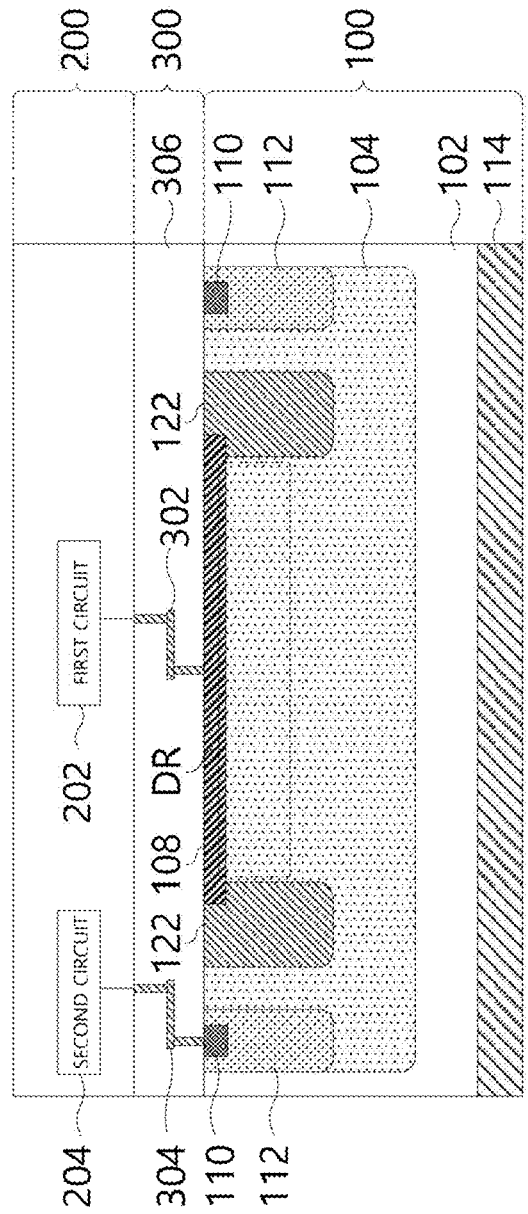
FIG. 6 shows a single photon detector according to an exemplary embodiment.

FIG. 6 shows a single photon detector according to an exemplary embodiment. Differences from those described with reference to FIG. 5 are described for brevity of description.

Referring to FIG. 6, a single photon detector 15 may be provided. Unlike the description with reference to FIG. 5, the second well 106 may not be provided between the heavily doped region 108 and the first well 104, and the first well 104 may directly contact the heavily doped region 108. In one example, the doping concentration of the first well 104 may be uniform. In another example, the doping concentration of the first well 104 may decrease as it is closer to the connection layer 300.

Figure 7:
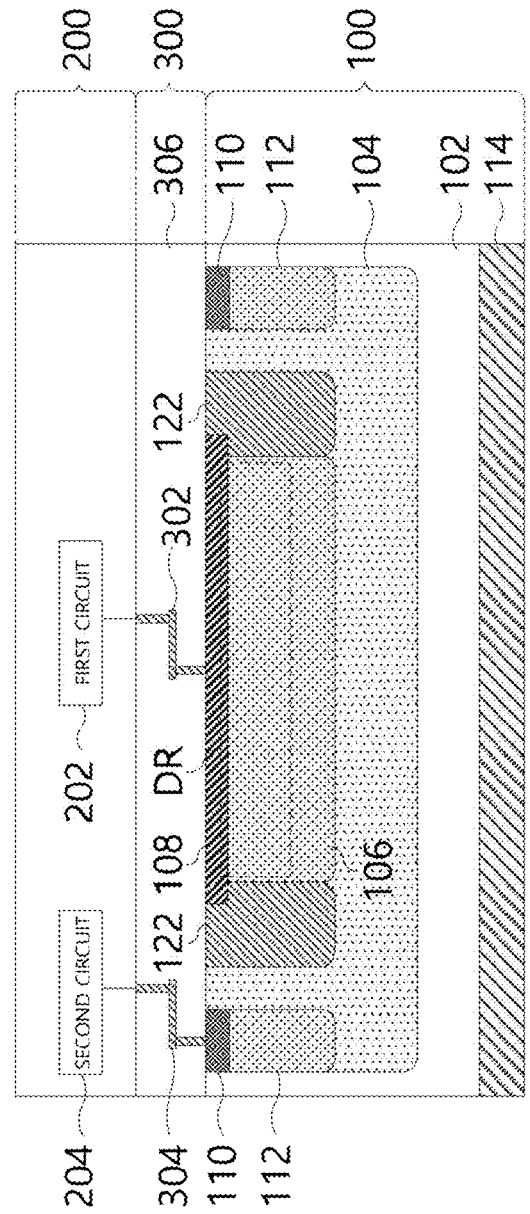
FIG. 7 shows a single photon detector according to an exemplary embodiment.

FIG. 7 shows a single photon detector according to an exemplary embodiment. Differences from those described with reference to FIG. 5 are described for brevity of description.

Referring to FIG. 7, a single photon detector 16 may be provided. Unlike the description with reference to FIG. 5, a side surface of the contact 110 may be aligned with a side surface of the relief region 112. In other words, the side surface of the contact 110 and the side surface of the relief region 112 may be coplanar. A side surface of the contact 110 may directly contact the first well 104 and the substrate region 102. A bottom surface of the contact 110 may directly contact the relief region 112.

Figure 8:
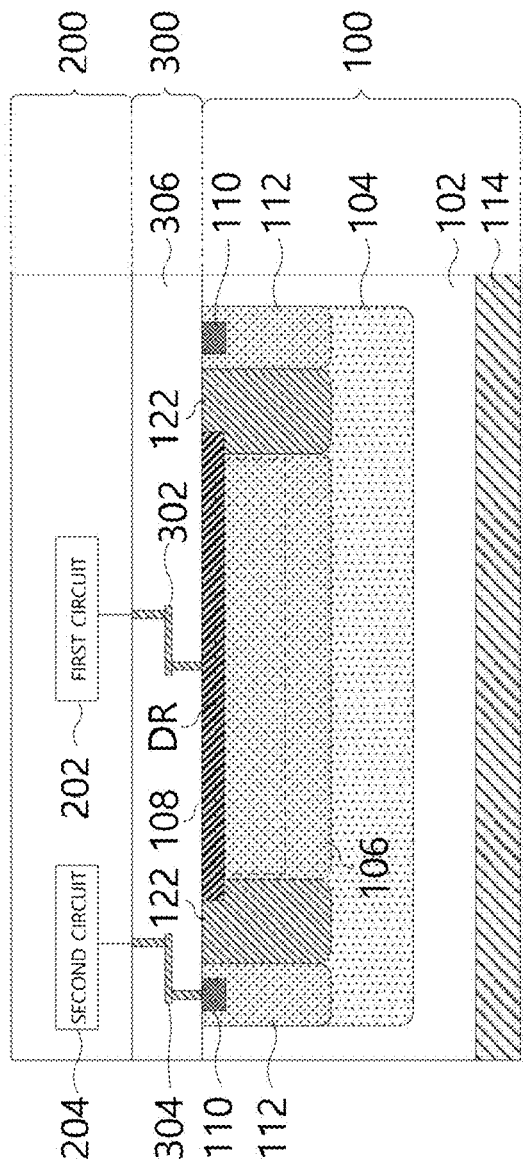
FIG. 8 shows a single photon detector according to an exemplary embodiment.

FIG. 8 shows a single photon detector according to an exemplary embodiment. Differences from those described with reference to FIG. 5 are described for brevity of description.

Referring to FIG. 8, a single photon detector 17 may be provided. Unlike the description with reference to FIG. 5, the guard ring 122 may directly contact the relief region 112. For example, the guard ring 122 may fill a region between the relief region 112 and the second well 106 and a region between the relief region 112 and the heavily doped region 108. When the bottom surface of the guard ring 122 is higher than the bottom surface of the second well 106, the guard ring 122 may fill a part of the region between the relief region 112 and the second well 106, One well 104 may fill another portion of the region between the relief region 112 and the second well 106.

Figure 9:
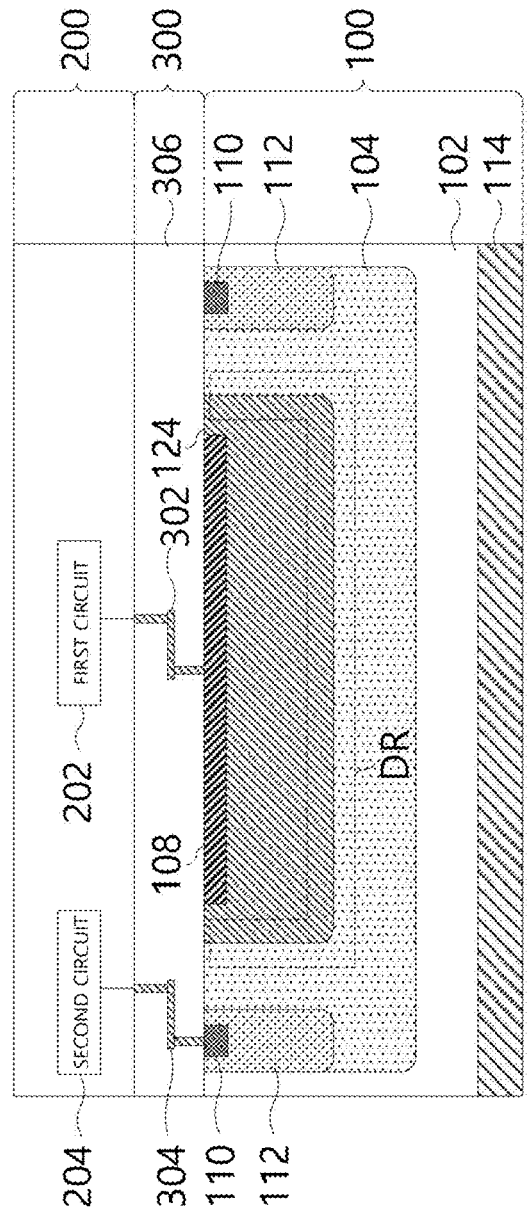
FIG. 9 shows a single photon detector according to an exemplary embodiment.

FIG. 9 shows a single photon detector according to an exemplary embodiment. Differences from those described with reference to FIG. 1 are described for brevity of description.

Referring to FIG. 9, a single photon detector 18 may be provided. Unlike the description with reference to FIG. 1, a third well 124 may be provided between the first well 104 and the heavily doped region 108. The second well 106 may not be provided. The third well 124 may separate the heavily doped region 108 and the first well 104 from each other. The third well 124 may have a second conductivity type like the heavily doped region 108. The third well 124 may have a lower doping concentration than the heavily doped region 108. For example, the doping concentration of the third well 124 may be $1 \times 10^{15}$ to $1 \times 10^{19}$ cm$^{-3}$. A depletion region DR may be formed in a region adjacent to an interface between the third well 124 and the first well 104. The depletion region DR of the present disclosure may be formed at a position deeper than the depletion region DR of FIGS. 1 to 8 formed in a region adjacent to the interface between the heavily doped region 108 and the first well 104.

Figure 10:
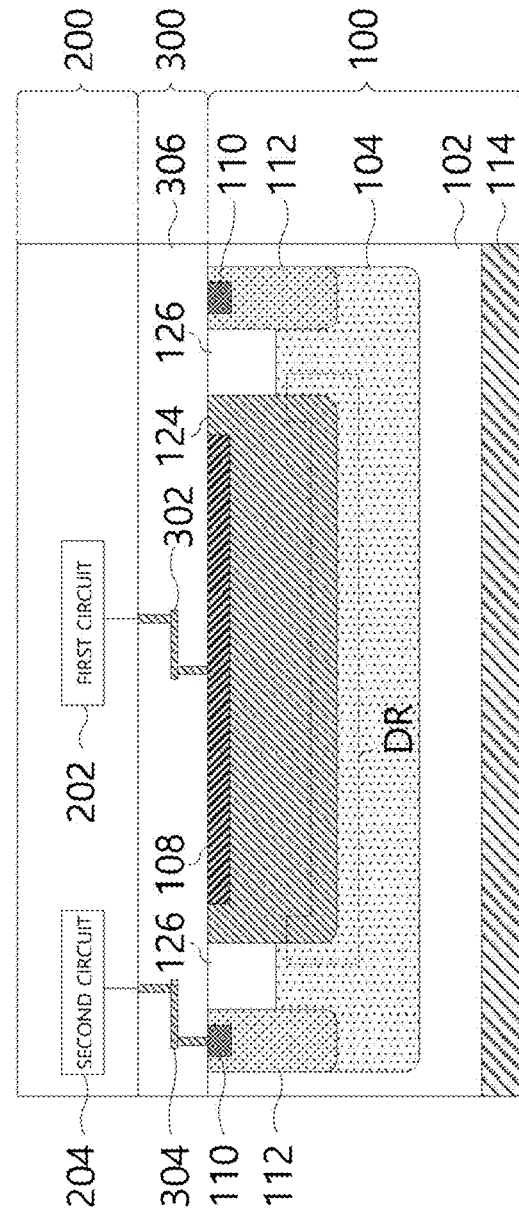
FIG. 10 shows a single photon detector according to an exemplary embodiment.

FIG. 10 shows a single photon detector according to an exemplary embodiment. Differences from those described with reference to FIG. 9 are described for brevity of description.

Referring to FIG. 10, a single photon detector 19 may be provided. Unlike the description with reference to FIG. 9, the sub-substrate region 126 may be provided between the relief region 112 and the third well 124. When viewed along the stacking direction of the detection element layer 100 and the connection layer 300, the sub-substrate region 126 may have a ring shape surrounding the third well 124. The sub-substrate region 126 may have the same conductivity type as the substrate region 102. The sub-substrate region 126 may have substantially the same doping concentration as the substrate region 102. For example, the doping concentration of the sub-substrate region 126 may be $1 \times 10^{14}$ to $1 \times 10^{18}$ cm$^{-3}$. The sub-substrate region 126 may extend from the top surface of the detection element layer 100 to a predetermined depth. For example, the bottom surface of the sub-substrate region 126 may be positioned at a height between the top surface and the bottom surface of the third well 124. In one example, the sub-substrate region 126 may be a region of a semiconductor substrate (eg, a silicon substrate) in which ions are not implanted or fewer ions are implanted in an ion implantation process for forming the first well 104.

Figure 11:
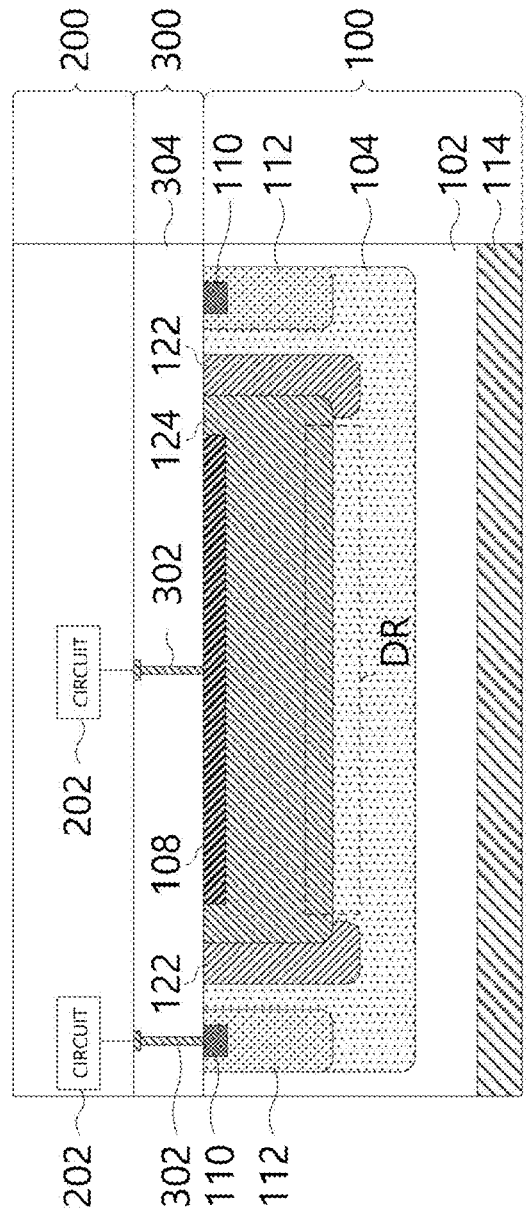
FIG. 11 shows a single photon detector according to an exemplary embodiment.

FIG. 11 shows a single photon detector according to an exemplary embodiment. Differences from those described with reference to FIG. 9 are described for brevity of description.

Referring to FIG. 11, a single photon detector 20 may be provided. Unlike the description with reference to FIG. 9, a guard ring 122 may be provided on a side surface of the third well 124. The guard ring 122 may extend from a region on the side surface of the third well 124 to a region on the bottom surface of the third well 124. The bottom surface of the guard ring 122 may be located closer to the bottom surface of the first well 104 than the bottom surface of the third well 124. The guard ring 122 may have a second conductivity type. The guard ring 122 may have a lower doping concentration than the third well 124. For example, the doping concentration of the guard ring 122 may be $1 \times 10^{15}$ to $1 \times 10^{18}$ cm$^{-3}$. The depletion region DR may be formed in a region adjacent to an interface between the third well 124 and the first well 104 between the guard ring 122.

Figure 12:
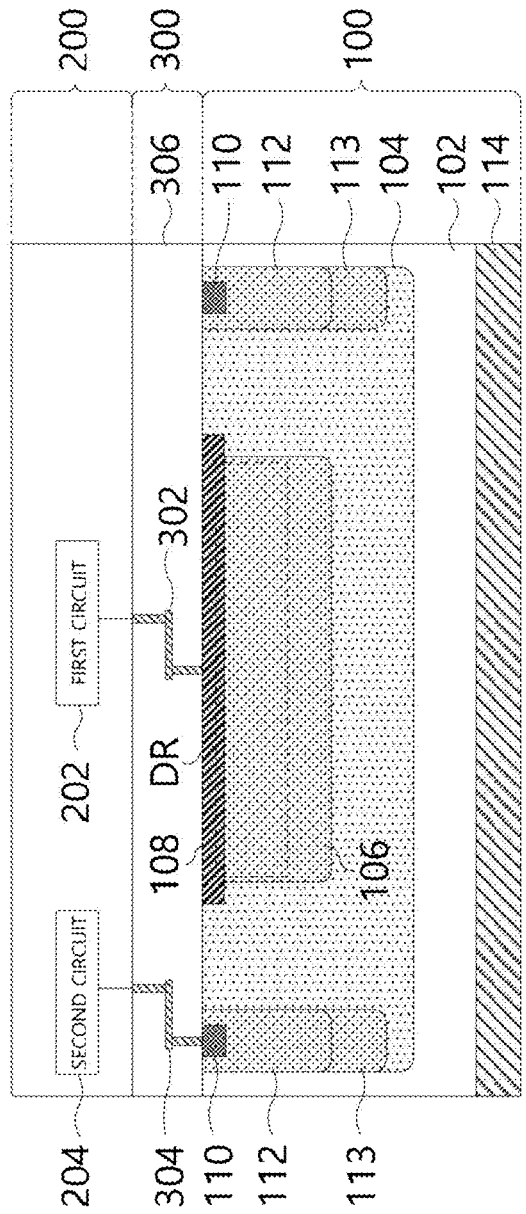
FIG. 12 shows a single photon detector according to an exemplary embodiment.

FIG. 12 shows a single photon detector according to an exemplary embodiment. Differences from those described with reference to FIG. 1 are described for brevity of description.

Referring to FIG. 12, a single photon detector 21 may be provided. Unlike the description with reference to FIG. 1, the single photon detector 21 may further include an additional relief region 113. An additional relief region 113 may be provided on the bottom surface of the relief region 112. The additional relief region 113 may be formed to a position deeper than the second well 106. The bottom surface of the additional relief region 113 may be disposed closer to the rear surface of the detection element layer 100 than the bottom surface of the second well 106. The side surface of the additional relief region 113 may be aligned with the side surface of the relief region 112. The side surface of the additional relief region 113 and the side surface of the relief region 112 may be coplanar. The additional relief region 113 may have a first conductivity type. For example, the doping concentration of the additional relief region 113 may be $1 \times 10^{15}$ to $1 \times 10^{18}$ cm$^{-3}$. The additional relief region 113 may improve electrical connection characteristics between the contact 110 and the first well 104. For example, the additional relief region 113 may reduce or prevent a voltage drop when a voltage is applied to the first well 104 through the contact 110. And the additional relief region 113 may be configured such that a voltage is uniformly applied to the first well 104.

Figure 13:
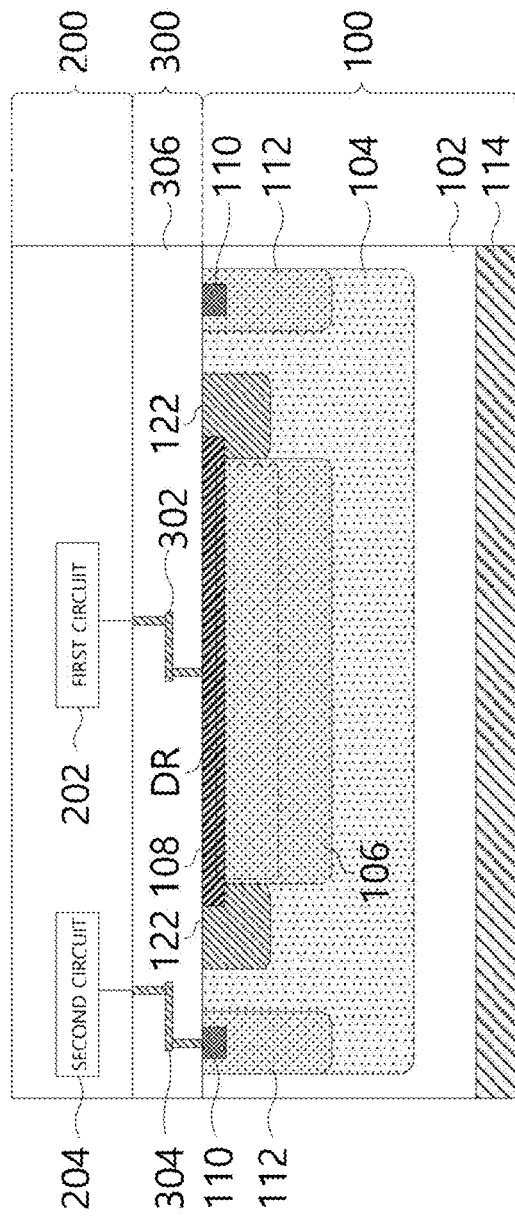
FIG. 13 shows a single photon detector according to an exemplary embodiment.

FIG. 13 shows a single photon detector according to an exemplary embodiment. Differences from those described with reference to FIG. 5 are described for brevity of description.

Referring to FIG. 13, a single photon detector 22 may be provided. Unlike the description with reference to FIG. 5, the bottom surface of the guard ring 122 may be disposed at a height between the bottom surface and the top surface of the second well 106. The guard ring 122 may be formed to a shallower depth than the second well 106. The guard ring 122 may be configured to reduce or prevent noise generation due to defects in the semiconductor substrate. The doping concentration of the guard ring 122 may be higher than that of the guard ring 122 described with reference to FIG. 5. For example, the doping concentration of the guard ring 122 may be $1 \times 10^{16}$ to $1 \times 10^{18}$ cm$^{-3}$.

Figure 14:
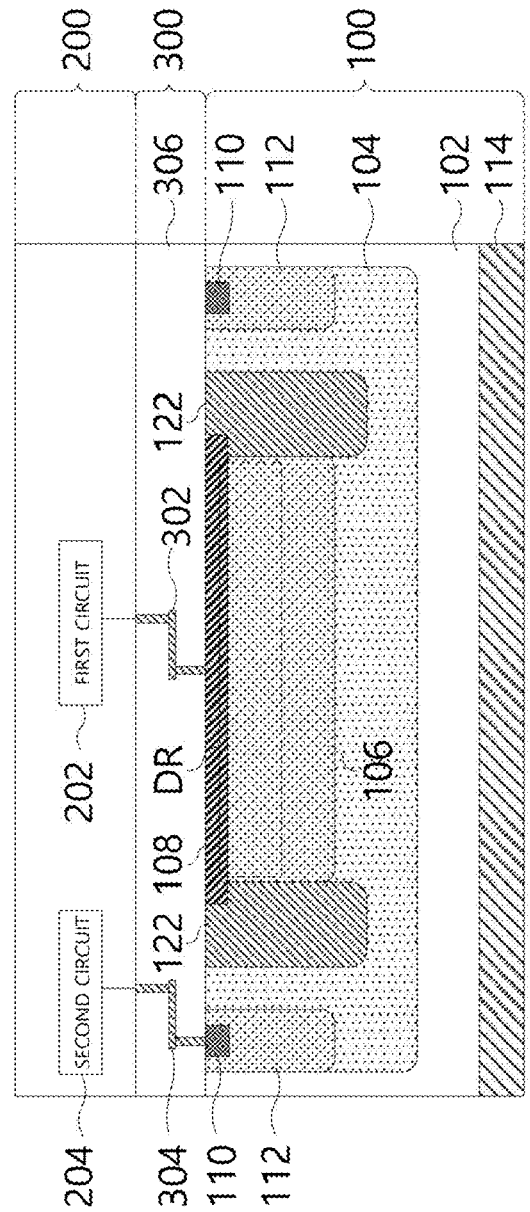
FIG. 14 shows a single photon detector according to an exemplary embodiment.

FIG. 14 shows a single photon detector according to an exemplary embodiment. Differences from those described with reference to FIG. 5 are described for brevity of description.

Referring to FIG. 14, a single photon detector 23 may be provided. Unlike the description with reference to FIG. 5, the bottom surface of the second well 106 may be disposed at a height between the bottom surface and the top surface of the guard ring 122. The guard ring 122 may be formed to a depth deeper than the second well 106. The guard ring 122 may be configured to reduce or prevent noise generation due to defects in the semiconductor substrate. The doping concentration of the guard ring 122 may be lower than that of the guard ring 122 described with reference to FIG. 5. For example, the doping concentration of the guard ring 122 may be $1 \times 10^{15}$ to $1 \times 10^{17}$ cm$^{-3}$.

Figure 15:
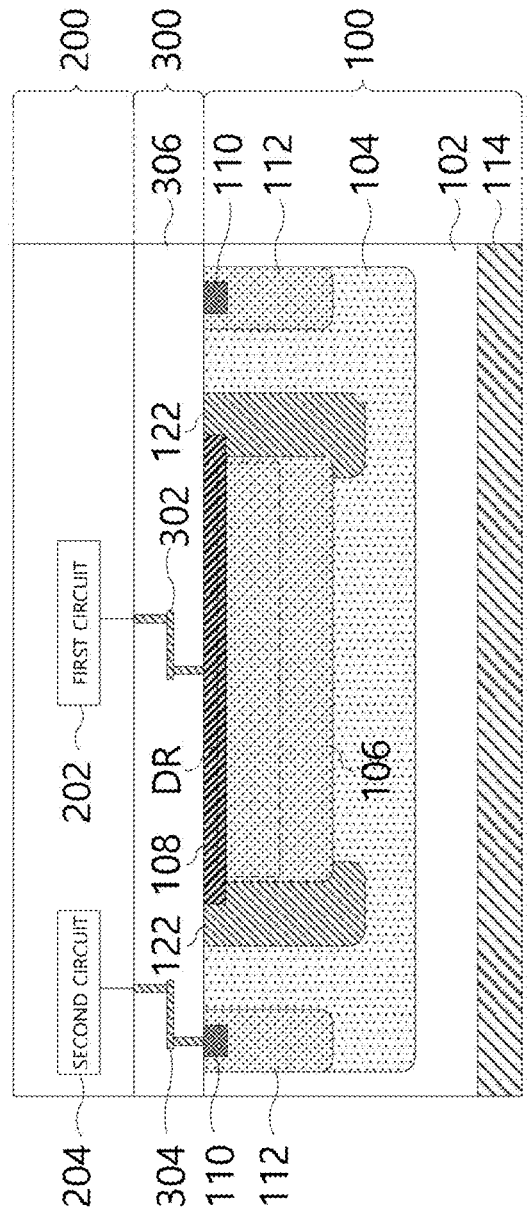
FIG. 15 shows a single photon detector according to an exemplary embodiment.

FIG. 15 shows a single photon detector according to an exemplary embodiment. Differences from those described with reference to FIG. 5 are described for brevity of description.

Referring to FIG. 15, a single photon detector 24 may be provided. Unlike the description with reference to FIG. 5, the guard ring 122 may extend from a region on the side surface of the second well 106 to a region on the bottom surface of the second well 106. The guard ring 122 may be formed to a depth deeper than the second well 106. The guard ring 122 may be configured to reduce or prevent noise generation due to defects in the semiconductor substrate. For example, the doping concentration of the guard ring 122 may be $1\times10^{15}$ to $1\times10^{18}$ cm$^{-3}$.

Figure 16:
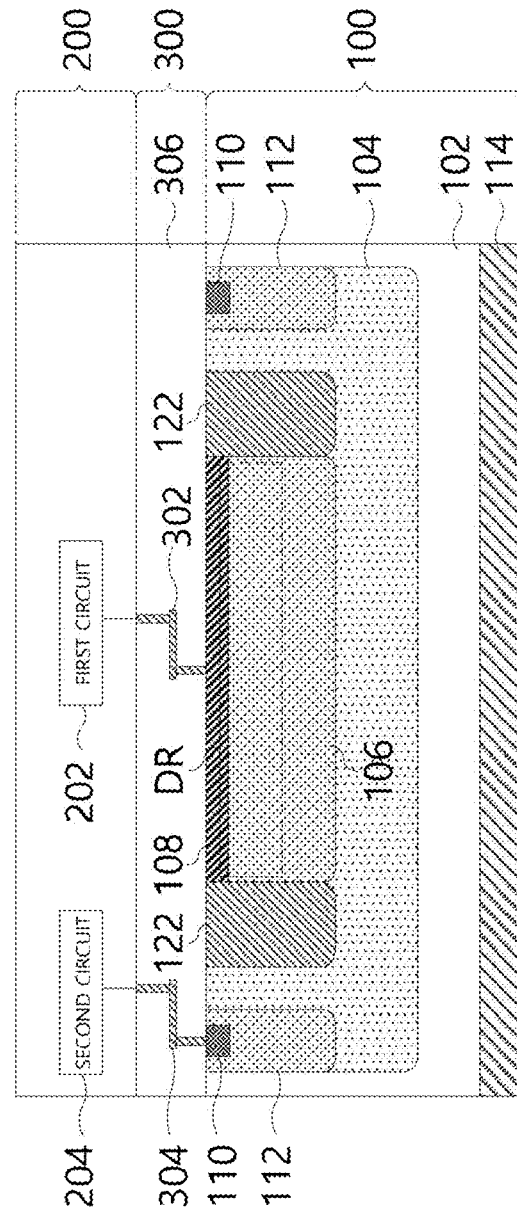
FIG. 16 shows a single photon detector according to an exemplary embodiment.

FIG. 16 shows a single photon detector according to an exemplary embodiment. Differences from those described with reference to FIG. 5 are described for brevity of description.

Referring to FIG. 16, a single photon detector 25 may be provided. Unlike the description with reference to FIG. 5, a side surface of the heavily doped region 108 may be aligned with a side surface of the second well 106. The side surface of the heavily doped region 108 may be coplanar with the side surface of the second well 106. An end portion of the heavily doped region 108 may not protrude from a side surface of the second well 106.

Figure 17:
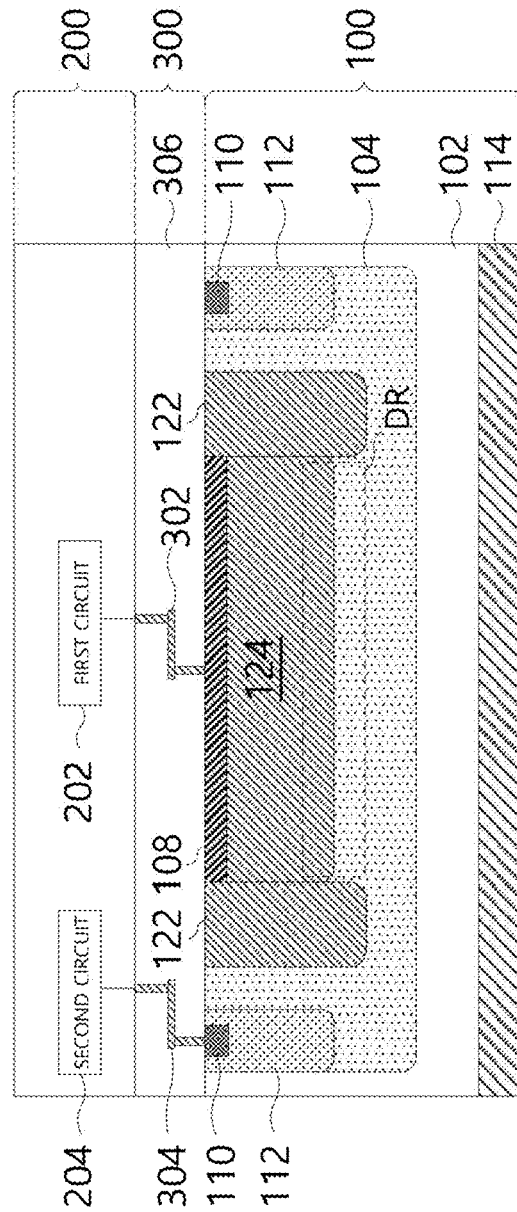
FIG. 17 shows a single photon detector according to an exemplary embodiment.

FIG. 17 shows a single photon detector according to an exemplary embodiment. Differences from those described with reference to FIG. 9 are described for brevity of description.

Referring to FIG. 17, a single photon detector 26 may be provided. Unlike the description with reference to FIG. 9, the guard ring 122 may be provided on the side surfaces of the heavily doped region 108 and the third well 124. The guard ring 122 may extend to a position deeper than the bottom surface of the third well 124. For example, the bottom surface of the guard ring 122 may be disposed closer to the bottom surface of the first well 104 than the bottom surface of the third well 124. The guard ring 122 may be configured to reduce or prevent noise generation due to defects in the semiconductor substrate. The guard ring 122 may have a lower doping concentration than the third well 124. For example, the doping concentration of the guard ring 122 may be $1\times10^{15}$ to $1\times10^{17}$ cm$^{-3}$. The depletion region DR may be formed adjacent to an interface between the third well 124 and the first well 104.

Figure 18:
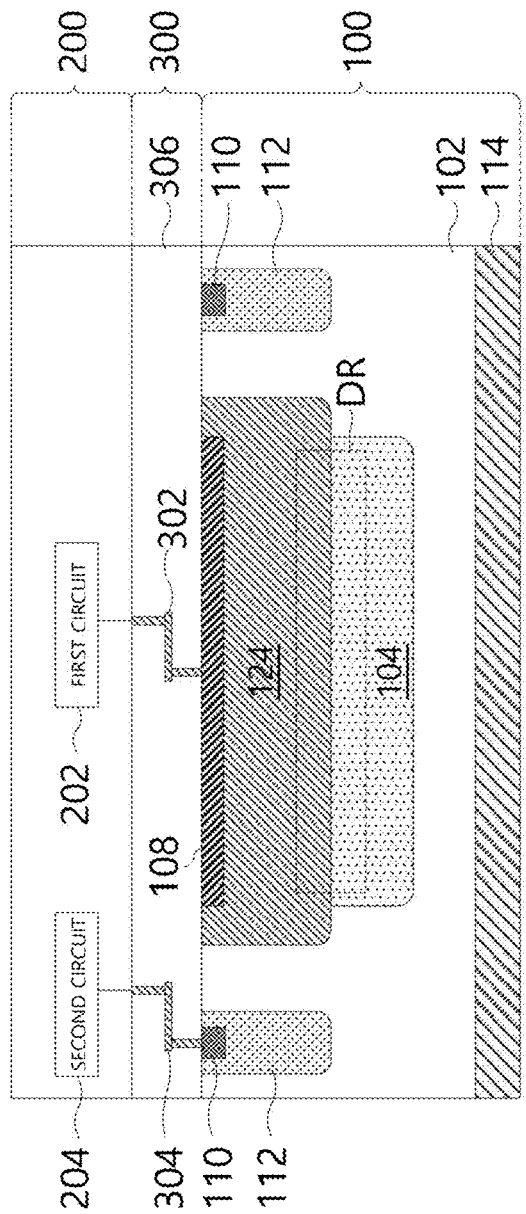
FIG. 18 shows a single photon detector according to an exemplary embodiment.

FIG. 18 shows a single photon detector according to an exemplary embodiment. Differences from those described with reference to FIG. 9 are described for brevity of description.

Referring to FIG. 18, a single photon detector 27 may be provided. Unlike described with reference to FIG. 9, the first well 104 may be disposed below the third well 124. In other words, the first well 104 may not be provided on a side surface of the third well 124. The depletion region DR may be formed in a region adjacent to an interface between the first well 104 and the third well 124.

Figure 19:
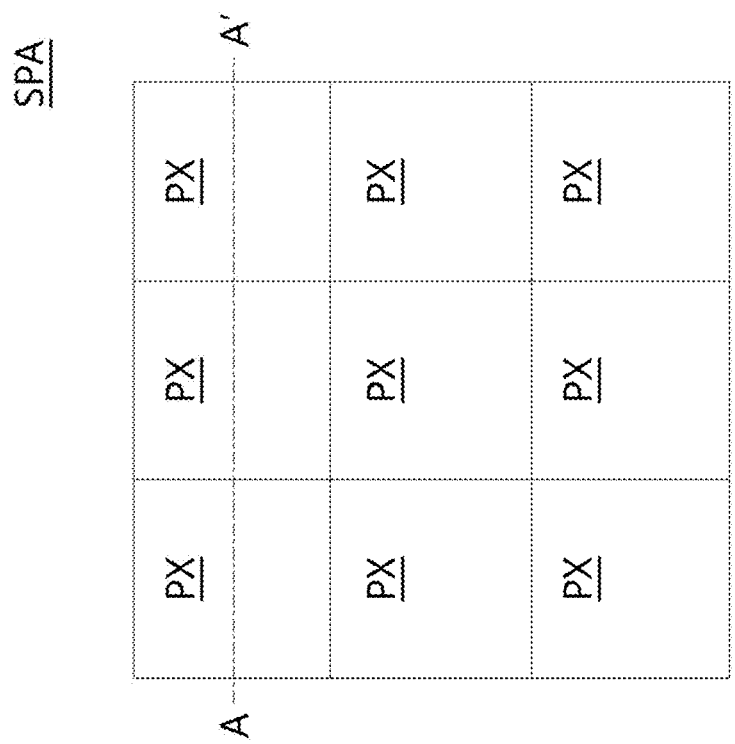
FIG. 19 is a top view of a single photon detector array according to an exemplary embodiment.
Figure 20:
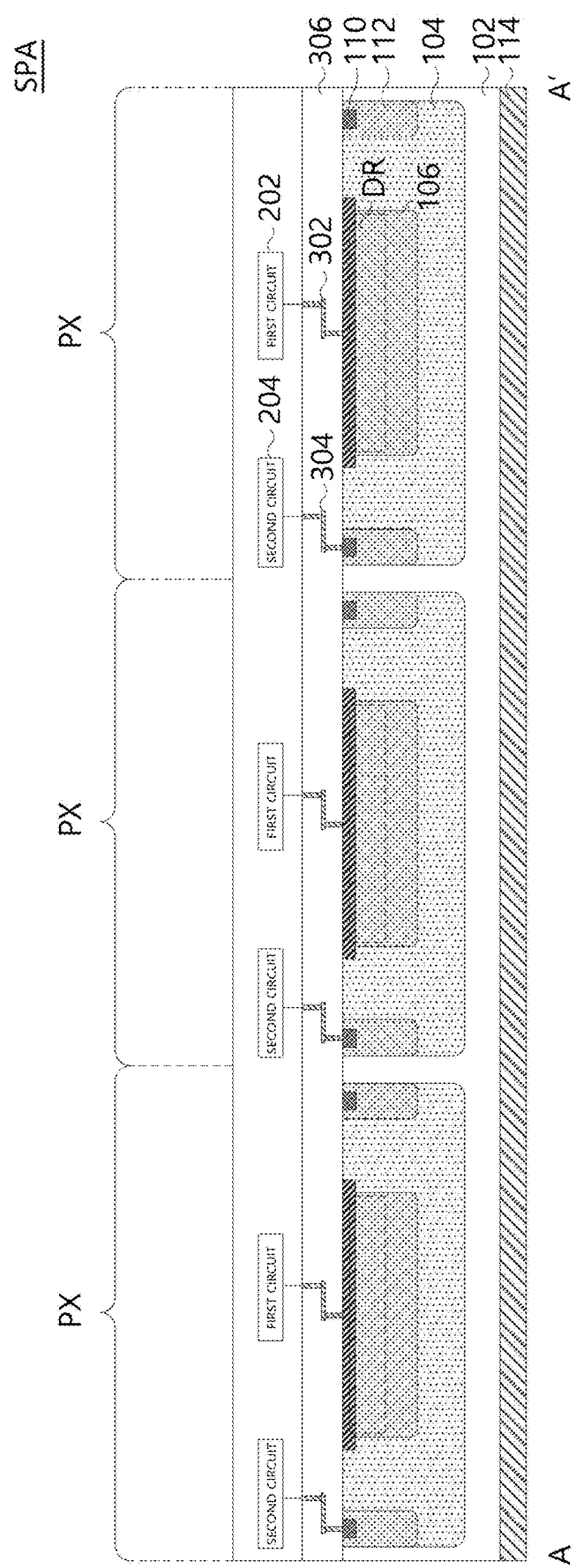
FIG. 20 is a cross-sectional view taken along line A-A' of FIG. 19.

FIG. 19 is a top view of a single photon detector array according to an exemplary embodiment. FIG. 20 is a cross-sectional view taken along line A-A' of FIG. 19. For conciseness of description, content substantially the same as that described with reference to FIG. 1 may not be described.

Referring to FIGS. 19 and 20, a single photon detector array SPA may be provided. The single photon detector array SPA may include pixels PX arranged in two dimensions. Although each of the pixels PX is illustrated as including the single photon detector 10 described with reference to FIG. 1, this is exemplary. In another example, each of the pixels PX may include any one of the single photon detectors 11 to 27 described above. The directly adjacent substrate regions 102, the directly adjacent control layers 200, and the directly adjacent connection layers 300 may be connected to each other.

In one example, an isolation layer (not shown) may be provided between the pixels PX. The isolation film can prevent a crosstalk phenomenon in which light incident on a pixel is sensed by another pixel adjacent to the pixel. For example, the isolation layer may include silicon oxide, silicon nitride, silicon oxynitride, polycrystalline silicon, low-k dielectric material, metal, or combinations thereof.

Figure 21:
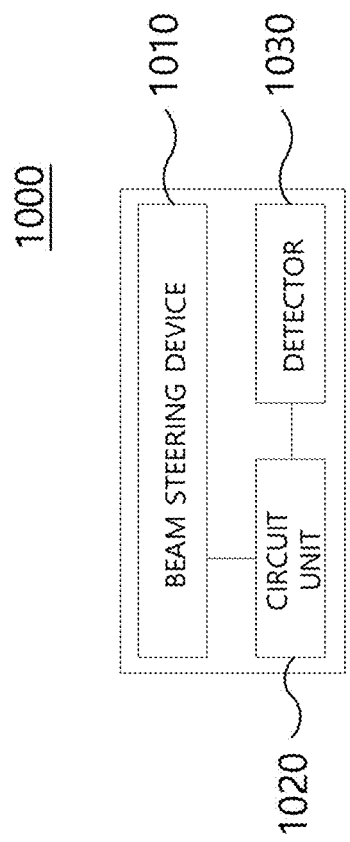
FIG. 21 is a block diagram for describing an electronic device according to an exemplary embodiment.

FIG. 21 is a block diagram for describing an electronic device according to an exemplary embodiment.

Referring to FIG. 21, an electronic device 1000 may be provided. The electronic device 1000 may radiate light toward a subject (not shown) and detect light reflected by the subject and returned to the electronic device 1000. The electronic device 1000 may include a beam steering device 1010. The beam steering device 1010 may adjust a direction of irradiation of light emitted to the outside of the electronic device 1000. The beam steering device 1010 may be a mechanical or non-mechanical (semiconductor) beam steering device. The electronic device 1000 may include a light source unit within the beam steering device 1010 or may include a light source unit provided separately from the beam steering device 1010. The beam steering device 1010 may be a scanning type light emitting device. However, the light emitting device of the electronic device 1000 is not limited to the beam steering device 1010. In another example, the electronic device 1000 may include a flash type light emitting device instead of the beam steering device 1010 or together with the beam steering device 1010. A flash-type light emitting device may radiate light to a region including an entire field of view at once without a scanning process.

The light steered by the beam steering device 1010 may return to the electronic device 1000 after being reflected by the subject. The electronic device 1000 may include a detector 1030 for detecting light reflected by the subject. The detector 1030 may include a plurality of light detection elements and may further include other optical members. The plurality of light detection elements may include any one of the single photon detectors 10 to 27 described above. In addition, the electronic device 1000 may further include a circuit unit 1020 connected to at least one of the beam steering device 1010 and the detection unit 1030. The circuit unit 1020 may include a calculation unit that acquires and calculates data, and may further include a driving unit and a control unit. In addition, the circuit unit 1020 may further include a power supply unit and a memory.

Although the case where the electronic device 1000 includes the beam steering device 1010 and the detection unit 1030 in one device is shown, the beam steering device 1010 and the detection unit 1030 are not provided as one device. The beam steering device 1010 and the detection unit 1030 may be provided separately in devices. In addition, the circuit unit 1020 may be connected to the beam steering device 1010 or the detection unit 1030 through conductive lineless communication without being conductive lined.

The electronic device 1000 according to the above-described embodiment may be applied to various electronic devices. As an example, the electronic device 1000 may be applied to a Light Detection And Ranging (LiDAR) device. The LiDAR device may be a phase-shift type device or a time-of-flight (TOF) type device. In addition, the single photon detectors 10 to 27 according to example embodiments or the electronic device 1000 including the same may be used in smart phones, wearable devices (glasses-type devices realizing augmented reality and virtual reality, etc.), and the Internet of Things (Internet of Things). IoT) devices, home appliances, tablet PCs (personal computers), PDAs (personal digital assistants), PMPs (portable multimedia players), navigation, drones, robots, unmanned vehicles, self-driving cars, and Advanced Drivers Assistance System (ADAS).

Figure 22:
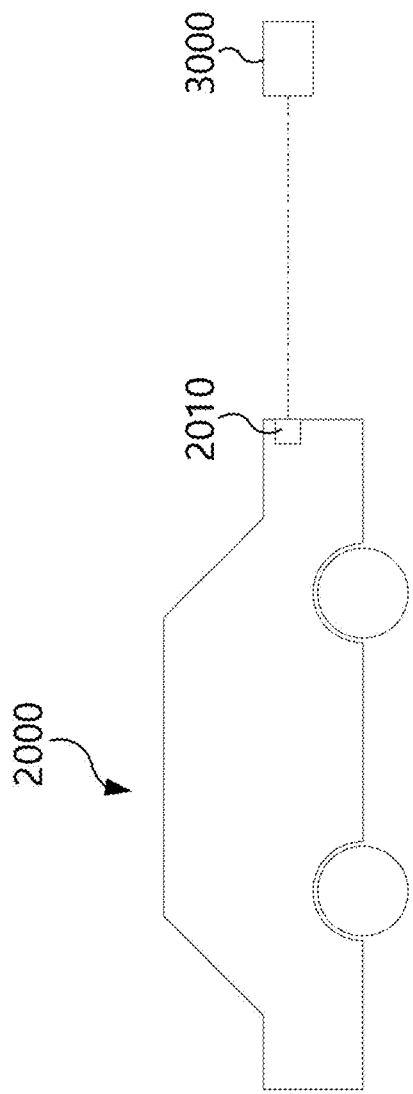
FIGS. 22 and 23 are conceptual diagrams illustrating cases in which a LiDAR device according to an exemplary embodiment is applied to a vehicle.
Figure 23:
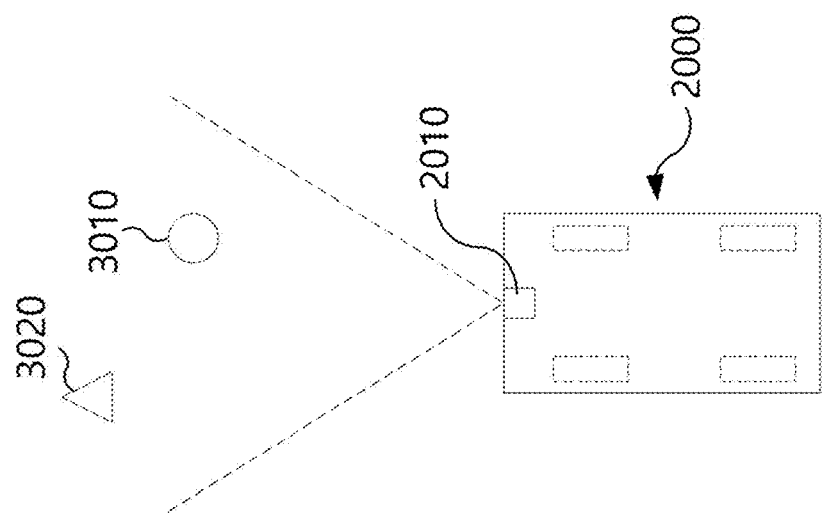

FIGS. 22 and 23 are conceptual diagrams illustrating cases in which a LiDAR device according to an exemplary embodiment is applied to a vehicle.

Referring to FIGS. 22 and 23, a LiDAR device 2010 may be applied to a vehicle 2000. Information on the subject 3000 may be obtained using a LiDAR device 2010 applied to a vehicle. The vehicle 2000 may be an automobile having an autonomous driving function. The LiDAR device 2010 may detect an object or person, ie, the subject 3000, in the direction in which the vehicle 2000 travels. The LiDAR device 2010 may measure the distance to the subject 3000 using information such as a time difference between a transmission signal and a detection signal. The LiDAR device 2010 may obtain information about a near subject 3010 and a far subject 3020 within a scanning range. The LiDAR device 2010 may include the electronic device 1000 described with reference to FIG. 21. It is illustrated that a LiDAR device 2010 is disposed in front of the vehicle 2000 to detect the subject 3000 in the direction in which the vehicle 2000 is traveling, but this is not limiting. In another example, the LiDAR device 2010 may be disposed at a plurality of locations on the vehicle 2000 to detect all subjects 3000 around the vehicle 2000. For example, four LiDAR devices 2010 may be disposed at the front, rear, and both sides of the vehicle 2000, respectively. In another example, the LiDAR device 2010 is disposed on the roof of the vehicle 2000 and rotates to detect all subjects 3000 around the vehicle 2000.

The foregoing are specific examples for carrying out the present inventive concepts. In addition to the above-described embodiments, the present inventive concepts will also include embodiments that can be simply or easily changed in design. In addition, the present inventive concepts will also include techniques that can be easily modified and practiced using example embodiments. Therefore, the scope of the present inventive concepts should not be limited to the above-described embodiments and should not be defined, and should be defined by those equivalent to the claims of this inventive concepts as well as the claims to be described below.

What is claimed is:

1. A single photon detector comprising:
   a semiconductor substrate; and
   a 2D material layer provided adjacent to the semiconductor substrate,
   wherein the semiconductor substrate includes a first well having a first conductivity type, a heavily doped region having a second conductivity type different from the first conductivity type, and a depletion region provided between the first well and the heavily doped region.

2. The single photon detector of claim 1, further comprising:
   a fixing layer provided between the semiconductor substrate and the 2D material layer.

3. The single photon detector of claim 1, further comprising:
   a transition layer provided between the semiconductor substrate and the 2D material layer.

4. The single photon detector of claim 1, wherein the 2D material layer is provided opposite the heavily doped region with the first well interposed therebetween.

5. The single photon detector of claim 1, further comprising:
   a substrate region provided between the first well and the 2D material layer.

6. The single photon detector of claim 1, wherein the 2D material layer includes a tin transition metal or a chalcogenide-based material.

7. The single photon detector of claim 1, further comprising:
   a second well provided between the first well and the heavily doped region,
   wherein the second well has the first conductivity type.

8. The single photon detector of claim 1, further comprising:
   a guard ring provided on a side surface of the heavily doped region,
   wherein the guard ring has the second conductivity type.

9. The single photon detector of claim 1, further comprising:
   a contact spaced apart from the heavily doped region; and
   a relief region provided between the contact and the first well,
   wherein the contact and the relief region have the first conductivity type.

10. The single photon detector of claim 1, further comprising:
    a conductive layer provided on an opposite side of the semiconductor substrate with the 2D material layer interposed therebetween,
    wherein the conductive layer includes a transparent conductive material.

11. The single photon detector of claim 1, further comprising:
    a conductive pattern provided on an opposite side of the semiconductor substrate with the 2D material layer interposed therebetween,
    wherein the conductive pattern includes a transparent conductive material or metal.

12. The single photon detector of claim 1, further comprising:
    a control layer provided on the the semiconductor substrate; and
    a connection layer provided between the control layer and the semiconductor substrate.

13. An electronic device comprising:
    a single photon detector including a semiconductor substrate and a 2D material layer provided adjacent to the semiconductor substrate,
    wherein the semiconductor substrate includes a first well having a first conductivity type, a heavily doped region having a second conductivity type different from the first conductivity type, and a depletion region provided between the first well and the heavily doped region.

14. A LIDAR device comprising:
    an electronic device including a single photon detector,
    wherein the single photon detector includes a semiconductor substrate and a 2D material layer provided adjacent to the semiconductor substrate,
    wherein the semiconductor substrate includes a first well having a first conductivity type, a heavily doped region having a second conductivity type different from the first conductivity type, and a depletion region provided between the first well and the heavily doped region.

* * * * *